(12) United States Patent
Yu et al.

(10) Patent No.: US 11,664,228 B2
(45) Date of Patent: May 30, 2023

(54) VACUUMIZING DEVICE AND VACUUMIZING METHOD FOR BONDING SUBSTRATE

(71) Applicant: SHANGHAI MICRO ELECTRONICS EQUIPMENT (GROUP) CO., LTD., Shanghai (CN)

(72) Inventors: Yuangen Yu, Shanghai (CN); Zhijun Huo, Shanghai (CN); Bin Zhao, Shanghai (CN); Hui Fu, Shanghai (CN); Xingxing Wang, Shanghai (CN)

(73) Assignee: SHANGHAI MICRO ELECTRONICS EQUIPMENT (GROUP) CO., LTD., Shanghai (CN)

( * ) Notice: Subject to any disclaimer, the term of this patent is extended or adjusted under 35 U.S.C. 154(b) by 396 days.

(21) Appl. No.: 16/627,693

(22) PCT Filed: Jun. 19, 2018

(86) PCT No.: PCT/CN2018/091877
§ 371 (c)(1),
(2) Date: Dec. 30, 2019

(87) PCT Pub. No.: WO2019/001311
PCT Pub. Date: Jan. 3, 2019

(65) Prior Publication Data
US 2020/0168459 A1 May 28, 2020

(30) Foreign Application Priority Data
Jun. 30, 2017 (CN) .......................... 201710526081.2

(51) Int. Cl.
*H01L 21/18* (2006.01)
*H01L 21/67* (2006.01)
(Continued)

(52) U.S. Cl.
CPC ...... *H01L 21/187* (2013.01); *H01L 21/67017* (2013.01); *H01L 21/67092* (2013.01);
(Continued)

(58) Field of Classification Search
CPC ............ H01L 21/187; H01L 21/67017; H01L 21/67092; H01L 21/67155;
(Continued)

(56) References Cited

U.S. PATENT DOCUMENTS

| 4,671,204 A | 6/1987 | Ballou |
| 5,300,175 A | 4/1994 | Gardner et al. |

(Continued)

FOREIGN PATENT DOCUMENTS

| CN | 2619363 Y | 6/2004 |
| CN | 1707323 A | 12/2005 |

(Continued)

OTHER PUBLICATIONS

Hashizume et al., System for Manufacturing Bonded Subtrate [JP 2006053582 A], pp. 9-10, Feb. 23, 2006, machine translation retrived from Espacenet <https://worldwide.espacenet.com>, retrieved on Aug. 30, 2022. (Year: 2006).*

Primary Examiner — Allen L Parker
Assistant Examiner — David W Houston, III
(74) *Attorney, Agent, or Firm* — Muncy, Geissler, Olds & Lowe, P.C.

(57) ABSTRACT

A vacuumizing device includes a vacuum chamber, a bonding fixture and a vacuumizing system. The bonding fixture is disposed in the vacuum chamber and includes a substrate table provided with a plurality of grooves for retention of the substrate by suction. The vacuumizing system is disposed in communication with both the vacuum chamber and grooves. During vacuumizing by the vacuumizing system, a vacuum value in the grooves is smaller than or equal to a vacuum value in the vacuum chamber. In the vacuumizing device and methods, the vacuumizing system is used to vacuumize the grooves in the substrate table and the vacuum chamber so that the vacuum value in the grooves is always smaller (Continued)

than or equal to that in the vacuum chamber. As a result, the substrates are firmly retained on the substrate table without warping, thereby improving the quality of substrate bonding.

11 Claims, 3 Drawing Sheets

(51) Int. Cl.
*H01L 21/683* (2006.01)
*H01L 21/687* (2006.01)

(52) U.S. Cl.
CPC .. *H01L 21/67155* (2013.01); *H01L 21/67242* (2013.01); *H01L 21/6838* (2013.01); *H01L 21/68785* (2013.01)

(58) Field of Classification Search
CPC ........... H01L 21/67242; H01L 21/6838; H01L 21/68785; H01L 21/68728; H01L 21/67005; H01L 21/2007; H01L 21/76251; H01L 33/0093
USPC ....................................................... 438/455
See application file for complete search history.

(56) References Cited

U.S. PATENT DOCUMENTS

| | | | | |
|---|---|---|---|---|
| 2004/0095546 | A1* | 5/2004 | Lee | B32B 38/1833 349/187 |
| 2004/0114095 | A1* | 6/2004 | Lee | B30B 1/18 349/187 |
| 2005/0275999 | A1* | 12/2005 | Chiang | H01L 21/6831 361/234 |
| 2008/0002137 | A1* | 1/2008 | Kim | G02F 1/1341 349/187 |
| 2008/0124199 | A1* | 5/2008 | Hwang | H01L 21/67092 414/218 |
| 2014/0318711 | A1 | 10/2014 | Wada et al. | |
| 2020/0294963 | A1* | 9/2020 | Soda | H01L 24/98 |

FOREIGN PATENT DOCUMENTS

| | | | | | |
|---|---|---|---|---|---|
| CN | 101794726 | A | | 8/2010 | |
| CN | 101826452 | A | | 9/2010 | |
| CN | 103715125 | A | | 4/2014 | |
| CN | 104347468 | A | | 2/2015 | |
| CN | 104465454 | A | | 3/2015 | |
| CN | 104538333 | A | | 4/2015 | |
| CN | 204315534 | U | | 5/2015 | |
| CN | 205810778 | U | | 12/2016 | |
| CN | 106340485 | A | | 1/2017 | |
| CN | 106340485 | A | * | 1/2017 | ............ H01L 21/68 |
| JP | 2005317727 | A | | 11/2005 | |
| JP | 2006053582 | A | | 2/2006 | |
| JP | 2006053582 | A | * | 2/2006 | ......... B32B 38/1841 |
| JP | 2007286520 | A | | 11/2007 | |
| JP | 2007286520 | A | * | 11/2007 | ......... B32B 38/1841 |
| JP | 2010167338 | A | | 8/2010 | |
| TW | 201307952 | A | | 2/2013 | |
| TW | 201906052 | A | | 2/2019 | |

* cited by examiner

VACUUMIZING DEVICE AND VACUUMIZING METHOD FOR BONDING SUBSTRATE

TECHNICAL FIELD

The present invention relates to semiconductor technology and, in particular, to a vacuumizing apparatus and vacuumizing methods.

BACKGROUND

Current semiconductor processes often involve a so-called bonding technique for combining two pieces of the same or different materials together, such as two wafers, two glass plates or one wafer and one glass plate, which are collectively referred to as substrates hereinafter for the sake of convenience of description. Substrate bonding is important to both front- and rear-end processes in the fabrication of three-dimensional semiconductor devices.

Current substrate bonding processes essentially include treating the surfaces of two substrates to be bonded together, aligning the substrates with each other and finally bonding the substrates together. The final bonding step essentially includes: placing a fixture loaded thereon with the two substrates that have been aligned into a chamber; closing the chamber and activating an evacuator to remove air from the chamber; setting process parameters for heating, pressurizing and cooling the two substrates loaded on the fixture; destroying the vacuum in the chamber after the substrates have been processed as expected; and opening the chamber and taking the fixture with the bonded substrates thereon out of the chamber.

As shown in FIG. 1, prior to the bonding, the upper and lower substrates 1, 2 aligned with each other may be loaded on the bonding fixture 0, the upper and lower substrates 1, 2 are separated by spacers 3 from each other and are locked against each other by clamping blocks 4, the clamping blocks 4 are arranged on a frame 5 of the fixture, and the chamber 9 is configured for receiving the bonding fixture 0 with the substrates that have been aligned with each other, the chamber 9 may be equipped with an evacuation pipe 8. In practice, the upper substrate 2 may be selected to be thick and rigid enough to resist downward warpage due to the own gravity of the upper substrate 2, which may lead to its early contact with the lower substrate 1. The lower substrate 1 may be placed on a substrate table 6 and applied manually on the upper surface of the lower substrate 1 with an adhesive layer, which may be heated to a suitable bonding condition by heating the fixture subsequent to the evacuation and then join the two substrates together that are brought into contact therewith by a pressurization process. However, in practice, a pressure difference may occur between top and bottom surfaces of the lower substrate 1 due to an insufficient air flow rate in vacuumizing channels 7 in the fixture, generating an upward force F on the lower substrate 1. Under the action of this force, the lower substrate 1 may warp upward, tending to undesirably bring the adhesive coated thereon into contact with the upper substrate 2, as shown in FIG. 2. However, since the two substrates are separated by the spacers from each other, and because the adhesive applied to the lower substrate 1 is thin, the gap between the two substrates can finally accommodate the substrate's vertical displacement due to the warpage. As a result, the two substrates will not come into contact with each other during the vacuumizing process.

Nevertheless, as the semiconductor market is continuing to grow, traditional manual adhesive application methods suffering from a lack of efficiency are being gradually replaced by modern machine-based ones. However, adhesive layers resulting from such modern methods are approximately 4 to 5 times thicker than those from the traditional approaches, leaving a significantly reduced gap between the two substrates loaded on a fixture for bonding, which can easily lead to undesired immature bonding of the substrates during vacuumizing. As a result of such early bonding, bubbles may be present between the bonded substrates, causing a great reduction in yield. The currently-adopted practice for prohibiting early bonding of substrates to be bonded is to create a sufficient gap between the two substrates by separating them apart with thicker spacers, which ensures that even upon warpage of the lower substrate, the adhesive applied thereto will not come into contact with the upper substrate. Although this approach can solve the problem of early bonding due to the lower substrate's warpage, alignment accuracy of the substrates that are more distant from each other because of the thicker spacers inserted between them may have to be compromised. Moreover, the expanded inter-substrate distance may lead to an offset of one of the substrates relative to the other when the spacers are withdrawn to allow bonding of the substrates. Further, such an offset may also occur during the warped lower substrate's restoration of its original flat shape subsequent to the completion of vacuumizing and lead to an increased defect rate.

Therefore, there is a need for a vacuumizing apparatus and method, which are free of early bonding of substrates during vacuumizing in a process for bonding the substrates together.

SUMMARY OF THE INVENTION

In view of the above, it is just an objective of the present invention to provide a vacuumizing apparatus and vacuumizing methods, which are capable of vacuumizing during bonding of substrates while not causing warpage of the substrates.

To this end, the provided vacuumizing device is intended to provide a vacuum environment for bonding of a substrate and includes a vacuum chamber, a bonding fixture and a vacuumizing system.

The bonding fixture is disposed in the vacuum chamber and includes a substrate table provided with a plurality of grooves, which are able to be vacuumized so that the substrate is retained by suction on the substrate table.

The vacuumizing system is configured for vacuumizing of both the vacuum chamber and the plurality of grooves, so that the substrate does not warp during the vacuumizing by the vacuumizing system.

Optionally, during the vacuumizing by the vacuumizing system, a vacuum value in the plurality of grooves is configured to be smaller than or equal to a vacuum value in the vacuum chamber.

Optionally, the vacuumizing system may include a first vacuumizing circuit for vacuumizing the vacuum chamber and a second vacuumizing circuit for vacuumizing the plurality of grooves, the first vacuumizing circuit in communication with the vacuum chamber, the second vacuumizing circuit in communication with the plurality of grooves.

Optionally, the first vacuumizing circuit may include a first pressure sensor, a primary vacuum pipe and a secondary vacuum pipe, the primary vacuum pipe connected in parallel to the secondary vacuum pipe, the first pressure sensor configured to monitor the first vacuumizing circuit and/or the second vacuumizing circuit, the primary vacuum pipe configured for gas-flow evacuation of the vacuum chamber, the secondary vacuum pipe configured for molecular-flow evacuation of the vacuum chamber.

Optionally, the primary vacuum pipe may be provided with a first vacuum pump, wherein the primary vacuum pipe has a first end in communication with the vacuum chamber and a second end in communication with the first vacuum pump.

Optionally, the secondary vacuum pipe may be provided with a second vacuum pump, the secondary vacuum pipe is disposed in series with or in parallel to the first vacuum pump.

Optionally, the first vacuumizing circuit may further include a first valve for controlling opening or closing of the primary vacuum pipe and/or the secondary vacuum pipe.

Optionally, the first vacuum pump may be a dry pump.

Optionally, the second vacuum pump may be a molecular pump.

Optionally, the second vacuumizing circuit may include a third vacuum pump and a second pressure sensor, the second pressure sensor configured for monitoring the second vacuumizing circuit.

Optionally, the second vacuumizing circuit may further include a second valve for controlling opening or closing of the second vacuumizing circuit.

Optionally, the third vacuum pump may be a dry pump.

Optionally, the second vacuumizing circuit may include a third vacuum pump and a second pressure sensor, the second pressure sensor configured for monitoring the second vacuumizing circuit, the first vacuumizing circuit connected to the second vacuumizing circuit to compensate for working efficiency of the second vacuumizing circuit.

Optionally, the third vacuum pump may be an air pump.

Optionally, the second vacuumizing circuit may further include a third valve for controlling connection or disconnection between the first vacuumizing circuit and the second vacuumizing circuit.

In order to achieve the above object, the present invention also provides a vacuumizing method for use with a vacuumizing apparatus to provide a vacuum environment for bonding of s substrate. The vacuumizing device includes a bonding fixture, a vacuum chamber and a vacuumizing system. The bonding fixture is provided with a plurality of grooves on a surface thereof. The vacuumizing method includes the steps of:

S1) placing the bonding fixture loaded thereon with the substrate into the vacuum chamber; and S2) vacuumizing the vacuum chamber and the plurality of grooves by the vacuumizing system so that a vacuum value in the plurality of grooves is smaller than or equal to a vacuum value in the vacuum chamber.

Optionally, step S2) may include the steps of:

S21) activating the vacuumizing system to vacuumize the plurality of grooves and, upon the vacuum value in the plurality of grooves reaching a first preset value, stopping or maintaining vacuumizing of the plurality of grooves by the vacuumizing system; and S22) activating the vacuumizing system to vacuumize the vacuum chamber and, upon the vacuum value in the vacuum chamber reaching a second preset value, completing vacuumizing of the vacuum chamber, wherein the first preset value is smaller than or equal to the second preset value.

In order to achieve the above object, the present invention also provides another vacuumizing method for use with a vacuumizing apparatus to provide a vacuum environment for bonding of substrates. The vacuumizing device includes a bonding fixture, a vacuum chamber and a vacuumizing system. The bonding fixture is provided with a plurality of grooves on a surface thereof. The vacuumizing method includes the steps of:

S1) placing the bonding fixture loaded thereon with the substrate into the vacuum chamber;

S2) activating the vacuumizing system to vacuumize the plurality of grooves and, upon a vacuum value in the plurality of grooves reaching a first preset value, stopping vacuumizing of the plurality of grooves by the vacuumizing system;

S3) activating the vacuumizing system to vacuumize the vacuum chamber and, upon a vacuum value in the vacuum chamber getting close to the vacuum value in the plurality of grooves, stopping vacuumizing of the vacuum chamber by the vacuumizing system; and S4) repeating steps S2) and S3) until the vacuum value in the vacuum chamber meets a requirement for bonding of the substrate.

Optionally, the vacuumizing method may further include:

S5) vacuumizing both the vacuum chamber and the plurality of grooves by the vacuumizing system and completing the vacuumizing upon a second preset value being reached.

In the provided vacuumizing apparatus and methods, the vacuumizing system evacuates air from the grooves in the substrate table and from the vacuum chamber so that the vacuum value in the grooves is always smaller than or equal to that in the vacuum chamber. As a result, the substrates are firmly retained on the substrate table and will not experience any warpage or relative displacement. This can result in enhanced substrate alignment and yield and hence better substrate bonding quality. In addition, with the present invention, an optimal spacer thickness can be ensured and the risk of compromised alignment accuracy due to thickened spacers can be avoided.

BRIEF DESCRIPTION OF THE DRAWINGS

In FIGS. 1 to 2: 1—lower substrate; 2—upper substrate; 3—spacer; 4—clamping block; 5—fixture frame; 6—substrate table; 7—groove; 8—evacuation pipe; 9—vacuum chamber.

In FIGS. 3 to 4: 11—support table; 12—press table; 13—bonding fixture; 14—vacuum chamber; 15—second pressure sensor; 16—third vacuum pump; 17—second valve; 18—third vacuum pump; 01—second vacuumizing circuit; 00—first vacuumizing circuit; 20—first pressure sensor; 21—second vacuum pump; 22—first vacuum pump; 23—first valve; 19—second valve.

In FIG. 5: 23—vacuum value profile of the vacuum chamber, 24—vacuum value profile of the groove.

DETAILED DESCRIPTION

The core concept of the present invention is to evacuate air from a vacuum chamber and from grooves formed in a substrate table on a bonding fixture and to thus provide a vacuum environment for bonding of substrates, in which a vacuum value in the grooves is always smaller than or equal to a vacuum value in the vacuum chamber throughout the vacuumizing process. In this way, the substrates can be firmly retained on the substrate table, so that the substrate does not warp, thus enabling better substrate bonding quality.

Specific embodiments of the vacuumizing apparatus and methods proposed in the present invention will be described below with reference to the accompanying drawings. Features and advantages of the invention will be more apparent from the following detailed description, and from the appended claims. Note that the accompanying drawings are provided in a very simplified form not necessarily presented to scale, with their only intention to facilitate convenience and clarity in explaining the embodiments.

Embodiment 1

Figure 3:
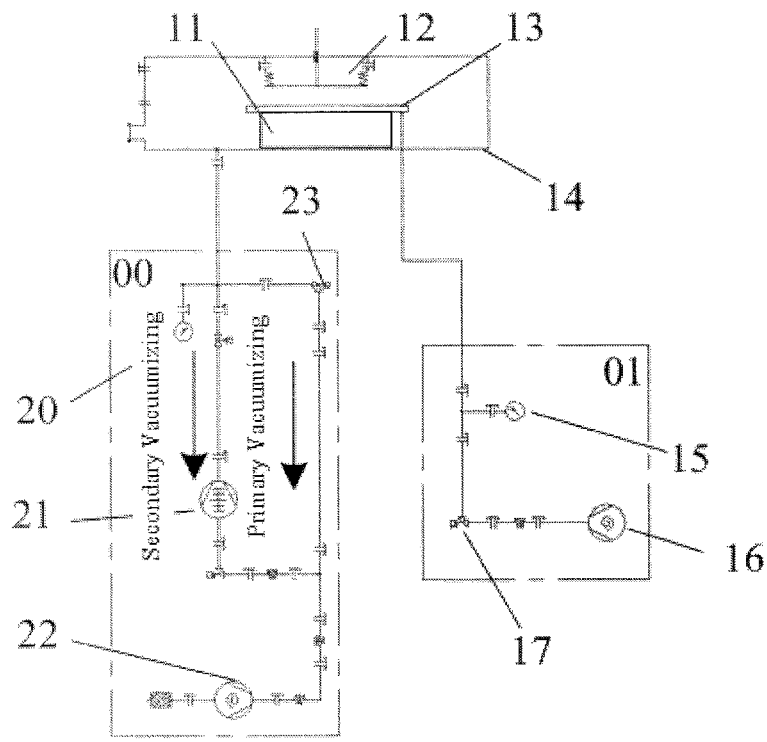
FIG. 3 is a schematic illustration of a vacuumizing apparatus according to a first embodiment of the present invention.

Referring to FIG. 3, in this embodiment, there is provided a vacuumizing apparatus including a vacuum chamber 14, a bonding fixture 13 and a vacuumizing system (including a first vacuumizing circuit 00 and a second vacuumizing circuit 01). The vacuumizing system is adapted to evacuate air from the vacuum chamber 14 and thus create a vacuum therein. In the vacuum chamber 14, a support table 11 and a press table 12 arranged above the support table 11 are disposed, and the bonding fixture 13 is placed on the support table 11 disposed in the vacuum chamber 14.

Figure 1:
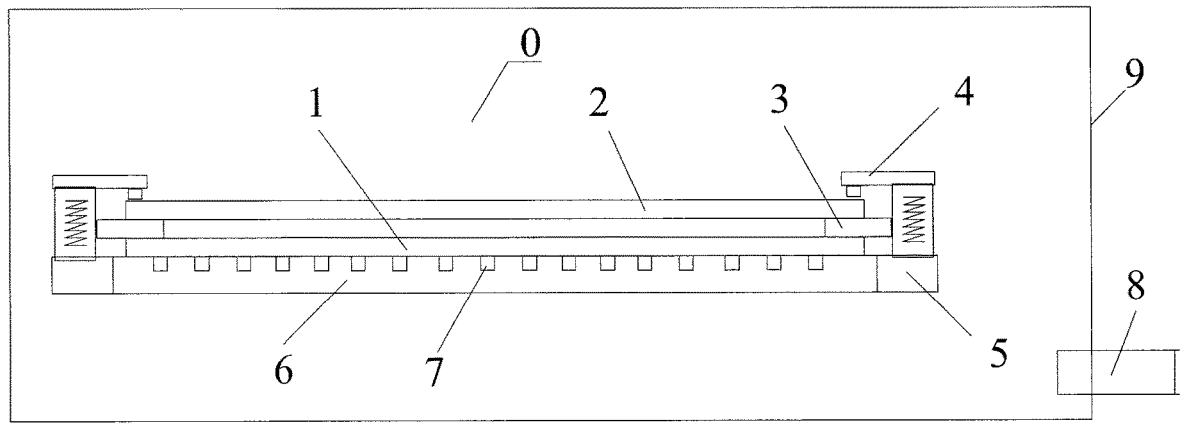
FIG. 1 schematically illustrates a prior-art bonding fixture prior to vacuumizing.
Figure 2:
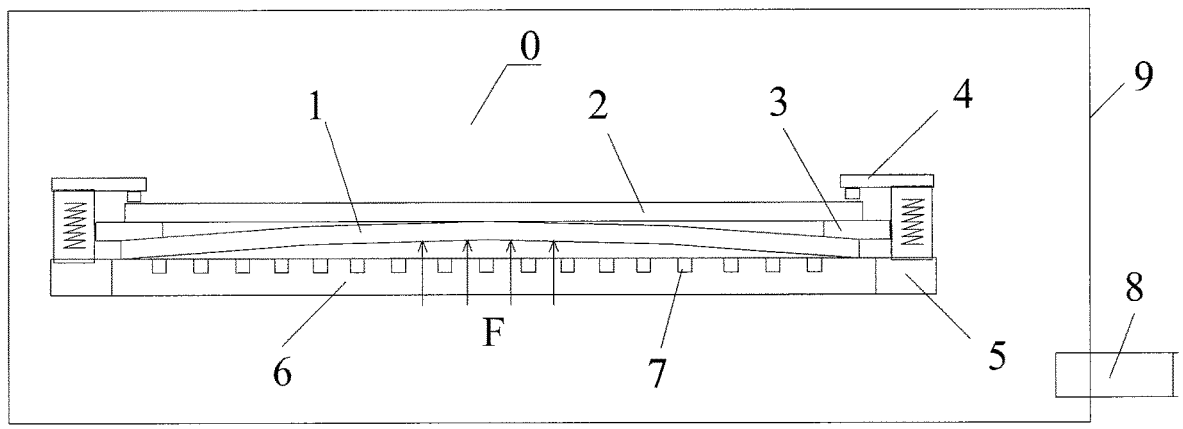
FIG. 2 schematically illustrates the prior-art bonding fixture subsequent to vacuumizing.

The bonding fixture 13 may be implemented as the bonding fixture 0 shown in FIGS. 1 to 2 and include a substrate table 6, a frame 5, clamping blocks 4 and spacers 3. During substrate loading, a lower substrate 1 is placed on the substrate table 6 that is provided with grooves 7, and an upper substrate 2 is disposed above the lower substrate 1 at a certain distance, with the spacers 3 separating them apart from each other. The grooves 7 are formed to retain the substrates by suction force and facilitate their alignment with each other.

The vacuum chamber 14 and the grooves 7 both communicate with the vacuumizing system. During a vacuumizing action by the vacuumizing system, a vacuum value in the grooves 7 is always kept smaller than or equal to a vacuum value in the vacuum chamber 14 so that the substrate is firmly pressed on the substrate table and will not warp, thereby effectively preventing early bonding of the substrate and ensuring good bonding quality.

Specifically, the vacuumizing system may include a first vacuumizing circuit 00 for vacuumizing of the vacuum chamber 14 and a second vacuumizing circuit 01 for vacuumizing of the grooves 7. The first vacuumizing circuit 00 may communicate with the vacuum chamber 14, while the second vacuumizing circuit 01 may communicate with the grooves 7.

The first vacuumizing circuit 00 may include a first vacuum pump 22, a second vacuum pump 21, a first pressure sensor 20, a primary vacuum pipe and a secondary vacuum pipe. The primary vacuum pipe may be disposed in communication with the vacuum chamber 14 at one end and with the first vacuum pump 22 at the other end. The secondary vacuum pipe may be connected in parallel to the primary vacuum pipe. The second vacuum pump 21 may be disposed in series within the secondary vacuum pipe, while the first pressure sensor 20 may be disposed in communication with the primary vacuum pipe. The primary vacuum pipe may be configured for gas-flow evacuation of the vacuum chamber 14, the secondary vacuum pipe may be configured for molecular-flow evacuation of the vacuum chamber 14. The first vacuum pump 22 and the second vacuum pump 21 may be disposed either in series or parallel.

Further, the first vacuumizing circuit may further include a first valve 23, the first valve 23 is disposed in series in the primary vacuum pipe and configured to control opening/closing of the first vacuumizing circuit.

Maximum vacuum value achievable by the first vacuum pump 22 may be 90-110 Pa and maximum vacuum value achievable by the second vacuum pump 21 may be 0.5-1 Pa. In other words, when the first vacuum pump 22 is operating at its maximum output and the second vacuum pump is idle, readings of the first pressure sensor 20 will be in the range of 90-110 Pa. When the second vacuum pump 21 is also operating at the maximum output, readings of the first pressure sensor 20 will be in the range of 0.5-1 Pa. It is noted that in the context of the present application, a lower vacuum value corresponds to a higher degree of vacuum as well as to thinner air.

It is also noted that the maximum achievable vacuum values of the first, second and third vacuum pumps 22, 21 and 16 are not limited to the ranges given above and may be suitably chosen by those skilled in the art based on the actual design requirements.

Further, the second vacuumizing circuit 01 may include a third vacuum pump 16, a second pressure sensor 15, a second valve 17 and a second vacuum pipe. The second vacuum pipe may be disposed in communication with the third vacuum pump 16 at one end and in communication with the grooves 7 at the other end. The second pressure sensor 15 may communicate with the second vacuum pipe. The second valve 17 may be disposed in series within the second vacuum pipe so as to control opening/closing of the second vacuumizing circuit 01.

Preferably, the third vacuum pump 16 may achieve a maximum vacuum value ranging from 90 Pa to 110 Pa.

In this embodiment, both the first and third vacuum pumps 22, 16 may be implemented as dry pumps and the second vacuum pump 21 may be implemented as a molecular pump.

On the basis of the above vacuumizing apparatus, there is also provided in this embodiment a vacuumizing method for providing a vacuum environment for bonding of substrates. The vacuumizing apparatus includes a bonding fixture, a vacuum chamber and a vacuumizing system. The bonding fixture is provided with grooves on the surface thereof. The vacuumizing method includes the steps of:

S1) placing the bonding fixture 13 loaded with the substrates into the vacuum chamber 14; and S2) evacuating air from the vacuum chamber 14 and the grooves 7 by the vacuumizing system so that a vacuum value in the grooves 7 is smaller than or equal to a vacuum value in the vacuum chamber 14.

Further, the step S2) may include the steps of:

S21) activating the vacuumizing system to vacuumize the plurality of grooves 7 and, upon the vacuum value in the grooves 7 reaching a first preset value, stopping or maintaining vacuumizing of the plurality of grooves 7 by the vacuumizing system; and S22) activating the vacuumizing system to vacuumize the vacuum chamber 14 and, upon the vacuum value in the vacuum chamber 14 reaching a second preset value, completing vacuumizing of the vacuum chamber 14.

The first preset value may be smaller than or equal to the second preset value so that a pressure in the grooves 7 is always smaller than or equal to a pressure in the vacuum chamber 14. As a result, the substrates can be firmly retained on the substrate table, so that the substrate does not warp. This method is simply by only requiring the second vacuumizing circuit 01 to be activated prior to the activation of the first vacuumizing circuit 00. The first and second preset values may be specifically set by those skilled in the art based on the actual process requirements.

Embodiment 2

Figure 4:
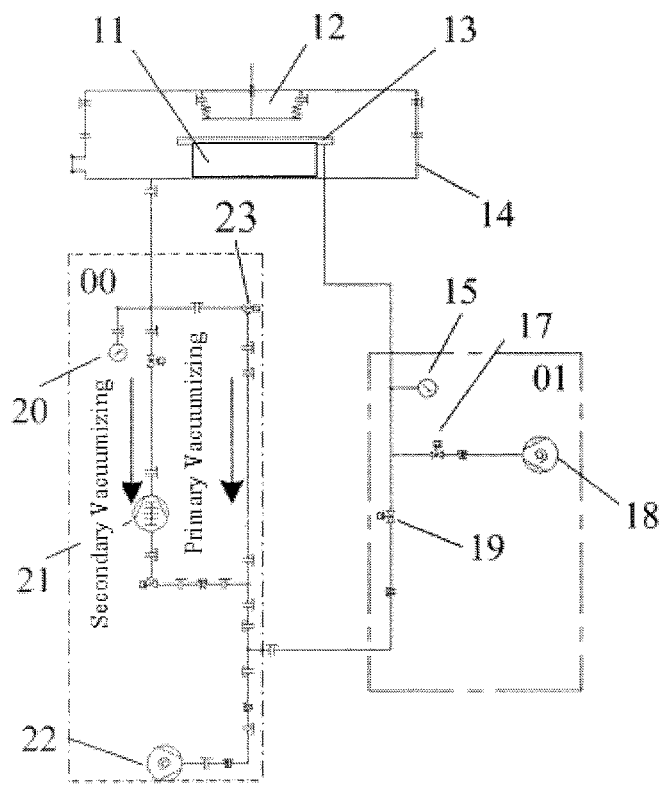
FIG. 4 is a schematic illustration of a vacuumizing apparatus according to a second embodiment of the present invention.

Referring to FIG. 4, in this embodiment, there is provided a vacuumizing apparatus differing from that of Embodiment 1 in employing an air pump or another low-power vacuum pump as the third vacuum pump 18, which is reduced in terms of size, footprint and cost, in place of the third vacuum pump 16 of Embodiment 1 that is implemented as a dry pump. A third valve 19 is also added to put the first vacuumizing circuit 00 and the second vacuumizing circuit 01 in communication with each other. The third valve 19 may be adapted to be able to control connection/disconnection between the first vacuumizing circuit 00 and the second vacuumizing circuit 01. The third valve 19 may have a first end in communication with the primary vacuum pipe and the third valve 19 may have a second end in communication with the second vacuum pipe.

The third vacuum pump 18 may achieve a maximum vacuum value in the range of 2400-2600 Pa. Therefore, its vacuumizing ability is obviously smaller than those of the aforementioned dry and molecular pumps. Additionally, each of the first valve 23, the second valve 17 and the third valve 19 may be implemented as a solenoid valve.

On the basis of the above vacuumizing apparatus, there is also provided in this embodiment a vacuumizing method include the steps of:

S1) placing the bonding fixture 13 loaded with the substrates into the vacuum chamber 14;

S2) activating the vacuumizing system to vacuumize the plurality of grooves 7 and, upon a vacuum value in the grooves 7 reaching a first preset value, stopping vacuumizing of the plurality of grooves 7 by the vacuumizing system;

S3) activating the vacuumizing system to vacuumize the vacuum chamber 14 and, upon a vacuum value in the vacuum chamber 14 getting close to that in the grooves 7, stopping vacuumizing of the vacuum chamber 14 by the vacuumizing system; and S4) repeating steps S2 and S3 until the vacuum value in the vacuum chamber 14 meets a requirement for bonding of the substrates.

The method may further include the step of:

S5) vacuumizing both the vacuum chamber 14 and the plurality of grooves 7 by the vacuumizing system and completing vacuumizing upon a second preset value being reached.

During vacuumizing of the vacuum chamber 14 and the grooves 7, since the vacuum value in the grooves 7 is always smaller than or equal to that in the vacuum chamber 14, and because an absolute seal between the grooves 7 and the vacuum chamber 14 is absent, when the vacuumizing operation of the vacuumizing system on the grooves 7 is ceased, the vacuum value in the grooves 7 may gradually climb back up. The vacuumizing operation on the vacuum chamber 14 may last for a period of time deter mined based upon a real-time value of the vacuum value in the grooves 7.

After the vacuumizing is completed, the press table 12 may apply a pressure on the bonding fixture 13 on the support table 11 in order to bond the upper substrate to the lower substrate.

The first and second preset values can be determined based on the actual design requirements by those skilled in the art and are not limited to particular values.

Preferably, in step S3, when the vacuum value in the vacuum chamber 14 increases above 100 Pa, a dry pump 22 may be additionally activated alternately with the second vacuum pump to evacuate the vacuum chamber 14 and the grooves 7. When the vacuum value in the vacuum chamber 14 is smaller than or equal to 100 Pa, the second vacuum pump 21 may be used to evacuate the vacuum chamber 14 and the grooves 7. When the vacuum value in the vacuum chamber 14 is smaller than or equal to 100 Pa, the air therein will be thin enough to disallow almost any warpage of the substrates. Therefore, during the vacuumizing of the vacuum chamber 14 and the grooves 7 by the second vacuum pump 21, the third valve 19 may remain in an "on" state.

The third vacuum pump 18 is configured mainly for a rapid decrease from a pressure of 1 bar, thereby reducing iterations of step S2 and step S3 and shortening the overall time required for the vacuumizing.

A more particular example will be given below to explain the vacuumizing method according to this embodiment.

In a first step, the bonding fixture 13 loaded with substrates that have been aligned with each other is placed into the vacuum chamber 14 and the vacuum chamber 14 is closed. The second vacuumizing circuit 01 is then activated with the third valve 19 being closed, followed by the activation of the second pressure sensor 15, the second valve 17 and the third vacuum pump 18. Upon pressure readings of the second pressure sensor 15 indicating that a predetermined vacuum value P1 is reached (the lowest vacuum value that can be achieved by the third vacuum pump 18 is about 2500 Pa), the third vacuum pump 18 is shut down (i.e., the second vacuumizing circuit 01 is deactivated), the first vacuumizing circuit 00 starts to work.

The first vacuumizing circuit 00 consists of two vacuumizing stages: a primary vacuumizing stage provided by the first vacuum pump (dry pump) 22 and a secondary vacuumizing stage provided by the second vacuum pump 21. The dry pump 22 is capable of achieving a maximum vacuum value of about 100 Pa and the second vacuum pump 21 is capable of achieving a maximum vacuum value of vacuum value of 1 Pa or lower.

Figure 5:
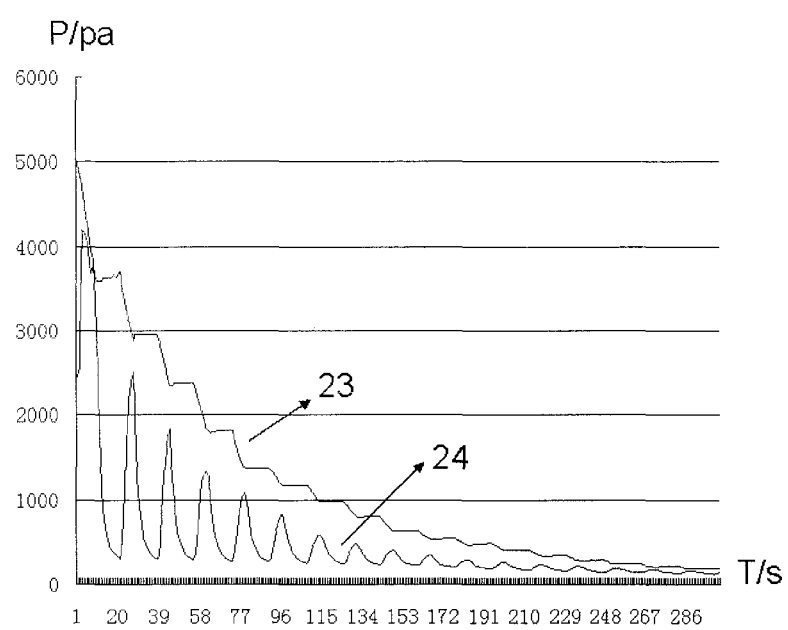
FIG. 5 shows the evolution of vacuum values respectively in a vacuum chamber and in grooves over time according to the second embodiment of the present invention.

In a second step, the dry pump 22 serving as the primary vacuumizing stage of the first vacuumizing circuit 00 is activated. As a result, the vacuum value P1 in the second vacuumizing circuit 01 will rise back to approximately 4200 Pa (due to diffusion of air from the vacuum chamber 14 to the grooves 7). Since the preset value of the first pressure sensor 20 is about 5000 Pa (>4200 Pa), the first vacuumizing circuit 00 is closed and the third valve 19 is opened to allow the dry pump 22 to evacuate the grooves 7 for about 10 seconds so that the vacuum value drops to about 300 Pa. Afterward, again, the third valve 19 is closed and the first vacuumizing circuit 00 is opened. Consequently, the vacuum value in the second vacuumizing circuit 01 (i.e., in the grooves 7) will climb back up to about 2500 Pa. At this point, the first vacuumizing circuit 00 is closed and the third valve 19 is opened for another time. This process is repeated 10 times, in which the dry pump 22 alternately evacuates the grooves 7 and the vacuum chamber 14, so that a vacuum environment suitable for bonding of the substrates can be established. As shown in FIG. 5, the vacuum value in the first vacuumizing circuit 00 (i.e., in the vacuum chamber 14) remains higher than that in the second vacuumizing circuit 01, ensuring avoidance of the occurrence of warpage.

In a third step, upon the vacuum values in both the circuits reaching about 100 Pa, a vacuum value limit of the dry pump 22, the second vacuum pump 21 serving as the secondary vacuumizing stage is activated to perform molecular-flow evacuation on the thin air in the vacuum chamber 14. As a result, the vacuum value in the vacuum chamber 14 can further drop to below 1 Pa, and the substrate will not experience any warpage throughout this process.

In summary, in the vacuumizing apparatus and methods provided in the present invention, the vacuumizing system evacuates air from the grooves in the substrate table and from the vacuum chamber so that the vacuum value in the grooves is always smaller than or equal to that in the vacuum chamber. As a result, the substrates are firmly retained on the substrate table and will not experience any warpage or relative displacement. This can result in enhanced substrate alignment and yield and hence better substrate bonding quality. In addition, with the present invention, an optimal spacer thickness can be ensured and the risk of compromised alignment accuracy due to thickened spacers can be avoided.

It is noted that the embodiments disclosed herein are described in a progressive manner, with the description of each embodiment focusing on its differences from others. Reference can be made between the embodiments for their identical or similar parts. Since the system embodiments correspond to the method embodiments, they are described relatively briefly, and reference can be made to the method embodiments for details in the system embodiments.

The description presented above is merely that of a few preferred embodiments of the present invention and does not limit the scope thereof in any sense. Any and all changes and modifications made by those of ordinary skill in the art based on the above teachings fall within the scope as defined in the appended claims.

What is claimed is:

1. A vacuumizing device, used for providing a vacuum environment for bonding of a substrate, the vacuumizing device comprising a vacuum chamber, a bonding fixture and a vacuumizing system,
wherein the bonding fixture is disposed in the vacuum chamber, the bonding fixture comprising a substrate table provided with a plurality of grooves, which are able to be vacuumized so that the substrate is retained by suction on the substrate table,
wherein the vacuumizing system is configured for vacuumizing of both the vacuum chamber and the plurality of grooves, so that the substrate does not warp during the vacuumizing by the vacuumizing system,
wherein the vacuumizing system comprises a first vacuumizing circuit for vacuumizing the vacuum chamber and a second vacuumizing circuit for vacuumizing the plurality of grooves, the first vacuumizing circuit in communication with the vacuum chamber, the second vacuumizing circuit in communication with the plurality of grooves,
wherein the second vacuumizing circuit comprises a third vacuum pump and a second pressure sensor, the second pressure sensor configured for monitoring the second vacuumizing circuit, the first vacuumizing circuit connected to the second vacuumizing circuit to compensate for working efficiency of the second vacuumizing circuit.

2. The vacuumizing device of claim 1, wherein during the vacuumizing by the vacuumizing system, a vacuum value in the plurality of grooves is configured to be smaller than or equal to a vacuum value in the vacuum chamber.

3. The vacuumizing device of claim 1, wherein the first vacuumizing circuit comprises a first pressure sensor, a primary vacuum pipe and a secondary vacuum pipe, the primary vacuum pipe connected in parallel to the secondary vacuum pipe, the first pressure sensor configured to monitor the first vacuumizing circuit and/or the second vacuumizing circuit, the primary vacuum pipe configured for gas-flow evacuation of the vacuum chamber, the secondary vacuum pipe configured for molecular-flow evacuation of the vacuum chamber.

4. The vacuumizing device of claim 3, wherein the primary vacuum pipe is provided with a first vacuum pump, wherein the primary vacuum pipe has a first end in communication with the vacuum chamber and a second end in communication with the first vacuum pump.

5. The vacuumizing device of claim 4, wherein the secondary vacuum pipe is provided with a second vacuum pump, the secondary vacuum pipe disposed in series with or in parallel to the first vacuum pump.

6. The vacuumizing device of claim 5, wherein the second vacuum pump is a molecular pump.

7. The vacuumizing device of claim 4, wherein the first vacuum pump is a dry pump.

8. The vacuumizing device of claim 3, wherein the first vacuumizing circuit further comprises a first valve for controlling opening or closing of the primary vacuum pipe and/or the secondary vacuum pipe.

9. The vacuumizing device of claim 1, wherein the second vacuumizing circuit further comprises a second valve for controlling opening or closing of the second vacuumizing circuit.

10. The vacuumizing device of claim 1, wherein the third vacuum pump is an air pump.

11. The vacuumizing device of claim 1, wherein the second vacuumizing circuit further comprises a third valve for controlling connection or disconnection between the first vacuumizing circuit and the second vacuumizing circuit.

\* \* \* \* \*